United States Patent [19]
Barton

[11] Patent Number: 6,085,762
[45] Date of Patent: Jul. 11, 2000

[54] APPARATUS AND METHOD FOR PROVIDING PULSED FLUIDS

[75] Inventor: Jerome C. Barton, Los Alamos, N. Mex.

[73] Assignee: The Regents of the University of California, Los Alamos, N. Mex.

[21] Appl. No.: 09/243,191

[22] Filed: Feb. 2, 1999

Related U.S. Application Data

[60] Provisional application No. 60/079,918, Mar. 30, 1998, and provisional application No. 60/079,919, Mar. 30, 1998.

[51] Int. Cl.$^7$ ...................................................... B08B 3/04
[52] U.S. Cl. ........................ 134/25.4; 134/34; 134/22.18; 134/186; 134/902; 137/256; 137/263
[58] Field of Search ................................... 134/94.1, 902, 134/104.2, 104.3, 109, 110, 111, 22.11, 22.12, 22.18, 166 R, 166 C, 186, 25.4, 26, 34; 137/826, 256, 263; 118/600

[56] References Cited

U.S. PATENT DOCUMENTS

| | | |
|---|---|---|
| 2,665,772 | 1/1954 | Greer et al. . |
| 3,175,569 | 3/1965 | Sowers, III ............................. 137/826 |
| 3,302,398 | 2/1967 | Taplin et al. ............................ 137/826 |
| 3,437,099 | 4/1969 | Griffin, Jr. ............................... 137/826 |
| 3,568,702 | 3/1971 | Dustin ..................................... 137/81.5 |
| 3,576,294 | 4/1971 | Baldwin .................................. 239/101 |
| 3,799,205 | 3/1974 | Fisher et al. ............................. 137/826 |
| 3,805,821 | 4/1974 | Bitner . |
| 3,885,591 | 5/1975 | O'Keefe ................................... 137/826 |
| 4,132,242 | 1/1979 | Carroll, Jr. . |
| 4,570,675 | 2/1986 | Fenwick et al. ......................... 137/805 |
| 4,622,996 | 11/1986 | Gillingham ............................. 137/590 |
| 4,660,588 | 4/1987 | Skraba . |
| 4,874,016 | 10/1989 | Tseng ...................................... 137/826 |
| 4,921,662 | 5/1990 | Franklin et al. ......................... 376/316 |
| 4,923,374 | 5/1990 | Lundin et al. ........................... 417/440 |
| 4,933,018 | 6/1990 | Prange et al. . |
| 5,082,502 | 1/1992 | Lee et al. ................................. 134/1 |
| 5,087,295 | 2/1992 | Gross et al. . |
| 5,165,629 | 11/1992 | Sajewski . |
| 5,195,560 | 3/1993 | Achmad .................................. 137/826 |
| 5,242,468 | 9/1993 | Clark et al. . |
| 5,273,590 | 12/1993 | St. Louis ................................. 134/22.1 |
| 5,330,072 | 7/1994 | Ferri, Jr. et al. . |
| 5,507,305 | 4/1996 | Franklin ................................. 134/57 R |
| 5,514,220 | 5/1996 | Wetmore et al. ....................... 134/22.18 |
| 5,533,539 | 7/1996 | Sutter et al. . |
| 5,595,201 | 1/1997 | Dobrez .................................. 134/57 D |
| 5,647,386 | 7/1997 | Kaiser ..................................... 134/113 |
| 5,722,447 | 3/1998 | Morgan et al. . |
| 5,819,801 | 10/1998 | Palffy ...................................... 137/826 |
| 5,832,948 | 4/1974 | Schell . |
| 5,882,589 | 3/1999 | Mariotti ................................. 422/28 |

FOREIGN PATENT DOCUMENTS

| | | | |
|---|---|---|---|
| 418851 | 9/1974 | U.S.S.R. ............................... 137/826 |
| 424131 | 9/1974 | U.S.S.R. ............................... 137/826 |
| 1 231 106 | 5/1971 | United Kingdom ................... 137/826 |
| 1231106 | 5/1991 | United Kingdom ................... 137/826 |

*Primary Examiner*—Frankie L. Stinson
*Attorney, Agent, or Firm*—Gemma Morrison Bennett

[57] ABSTRACT

There is provided a method and apparatus for supplying pulsed fluids to pressure vessels which comprises: at least one reservoir for the fluid to be pulsed; valved conduits connecting the reservoir to a pump; a conduit with control valves from the pump to one or more ballast tanks with the control valves able to sequentially or intermittantly direct a flow of fluid into each of the ballast tanks; conduits from each of the ballast tanks to a control valve and injection valve which injects fluid from the conduits from each of the ballast tanks into a high pressure processing vessel where materials to be contacted with the pulsed fluid are contacted with the fluid. For recycling the processing fluid, a conduit from the high pressure processing vessel can be connected to a separator vessel, secondary processing vessel or storage vessel. Conduits can be provided from the separator vessel, secondary processing vessel or storage vessel whereby the processing fluid can be returned to the reservoir for reuse in the process or conducted elsewhere for other purposes.

41 Claims, 2 Drawing Sheets

APPARATUS AND METHOD FOR PROVIDING PULSED FLUIDS

This application claims the benefit of U.S. Provisional application Ser. No. 60/079,918, filed Mar. 30, 1998, and U.S. Provisional application Ser. No. 60/079,919, filed Mar. 30, 1998.

TECHNICAL FIELD

This invention relates to an apparatus and a method for providing pulsed fluids. It is particularly useful for providing pulsed supercritical fluids to coated surfaces to be treated with the supercritical fluids.

This invention was made with government support under Contract No. W-7405-ENG-36 awarded by the U.S. Department of Energy. The government has certain rights in the invention.

BACKGROUND

There are many scientific and industrial processes which require delivery of a fluid to a surface for treatment of that surface or for removal of soluble materials from that surface. In some of these applications the fluid needs to be delivered in a pulsed manner, with high pressure and low pressure streams of fluid being alternated. In some of these applications the fluid has to be kept in a supercritical phase while the surface is being contacted with the fluid.

One particularly suitable use of the invention apparatus is described in an application for a patent filed on even date herewith covering the invention of certain fluids to be used for removal of photoresist materials from substrates used in the manufacture of integrated circuits or other electronic components.

During manufacture of integrated circuits, commonly referred to as semiconductor chips or microchips, several iterations of a photolithographic process are used. In this manufacturing process, electrically conductive ion implant gates of an electrically conductive barrier layer such as silicon dioxide, silicon nitride or metal is first deposited upon a substrate such as a silicon or gallium arsenide wafer by any of several suitable processes such as thermal oxidation, chemical vapor deposition, sputtering, ion implantation or vacuum evaporation.

After formation or deposition of the electrically conductive barrier layer, a photoresist material is applied to the wafer by any suitable means including, but not limited to, spinning of the wafer to distribute liquid photoresist evenly on the surface of the wafer.

Usually the photoresist material coated wafer is then heated in a "soft bake" or prebake step to improve adhesion of the photoresist material to the substrate surface and/or the barrier layer and to remove solvent from the generally polymeric photoresist material.

After the photoresist is soft baked onto the barrier layer, portions of the soft baked photoresist coated wafer are selectively exposed to high energy light such as high intensity ultraviolet light in a desired pattern defined by a photomask. Developing agents are then used to develop the portions of the photoresist material which were exposed to the high energy light.

When positive photoresist materials are used, the developed portions of the photoresist materials are solubilized by the exposure to the light and development and then are washed away, leaving portions of the barrier layer coated wafer exposed and other portions of the wafer coated with barrier layer underneath the remaining, unexposed and undeveloped photoresist layer.

Conversely, when negative photoresist materials are used, the undeveloped portions of the photoresist materials are selectively removed for exposing selected portions of the barrier material coated substrates in the desired patterns.

Once the pattern of photoresist has been established on the wafer, the wafer is "hard baked" to densify and toughen the photoresist material and improve adhesion to the barrier layer. The exposed substrate and/or barrier material is then etched (removed) by any of several suitable methods, depending upon which materials were used as the barrier layer. Wet chemical etching, dry etching, plasma etching, sputter etching or reactive-ion etching processes may be used. The etching processes remove barrier material which is unprotected by photoresist, leaving both portions of bare wafer and portions of wafer having layered coatings of barrier layer and the photoresist material which protected the barrier layer underneath from the etching process on the surface of the wafer.

The wafer having on its surface the pattern of barrier layer material coated with photoresist material is then treated in an aggressive step to remove the hard baked photoresist material from the remaining pattern of barrier layer material. This has traditionally been done using solvent washes such as halogenated hydrocarbons, mixtures of sulfuric acid and hydrogen peroxide, or highly alkaline mixtures of hydroxides with activators. Use of any of these solvent mixtures produces large undesirable liquid waste streams.

After removal of the hard baked photoresist material, in a final step the substrate with the patterned surface layer on it is washed with deionized water to ensure that all traces of photoresist removal solvents are removed from the wafer surface. This photolithographic process is repeated as many times as needed to produce as many layers of different patterns of the electrically conductive barrier layer material upon the substrate as desired, often creating large waste streams of contaminated water.

There is a need for methods of effectively removing photoresist materials in ways that reduce the amount of undesirable waste streams.

More generally, there is a need for an apparatus and method for providing pulsed fluids to reaction sites or surfaces to be treated with those fluids and, more particularly, there is a need for an apparatus and method for providing pulsed supercritical fluids to surfaces to be treated with the supercritical fluids.

Therefore it is an object of this invention to provide an apparatus and method for providing a pulsed fluid to a reaction site or surface to be treated with the fluid.

It is another object of this invention to provide a method and apparatus for removing photoresist materials used in the manufacture of integrated circuits or other electronic components such as circuit boards, optical waveguides and flat panel displays.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims. The claims appended hereto are intended to cover all changes and modifications within the spirit and scope thereof.

DISCLOSURE OF INVENTION

To achieve the foregoing and other objects, and in accordance with the purposes of the present invention, as embodied and broadly described herein, a means for providing pulsed fluids to pressure vessels or reaction sites comprises: at least one reservoir for the fluid to be pulsed; valved conduits connecting the reservoir to a pumping means; a conduit with at least one control valve from the pumping means to one or more ballast tanks with the control valve able to sequentially or intermittantly direct a flow of fluid into each of the ballast tanks; conduits from each of the ballast tanks to a control and injection valve which injects fluid from the conduits from each of the ballast tanks into a high pressure processing vessel where the materials to be contacted with the pulsed fluid are contacted with the fluid.

For recycling the processing fluid, a conduit from the high pressure processing vessel can be connected to a single or multi-unit separator vessel, secondary processing vessel or storage vessel. Conduits can be provided from the separator vessel, secondary processing vessel or storage vessel whereby the processing fluid can be returned to the reservoir for reuse in the process or conducted elsewhere for other purposes.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

BEST MODES FOR CARRYING OUT THE INVENTION

Figure 1:
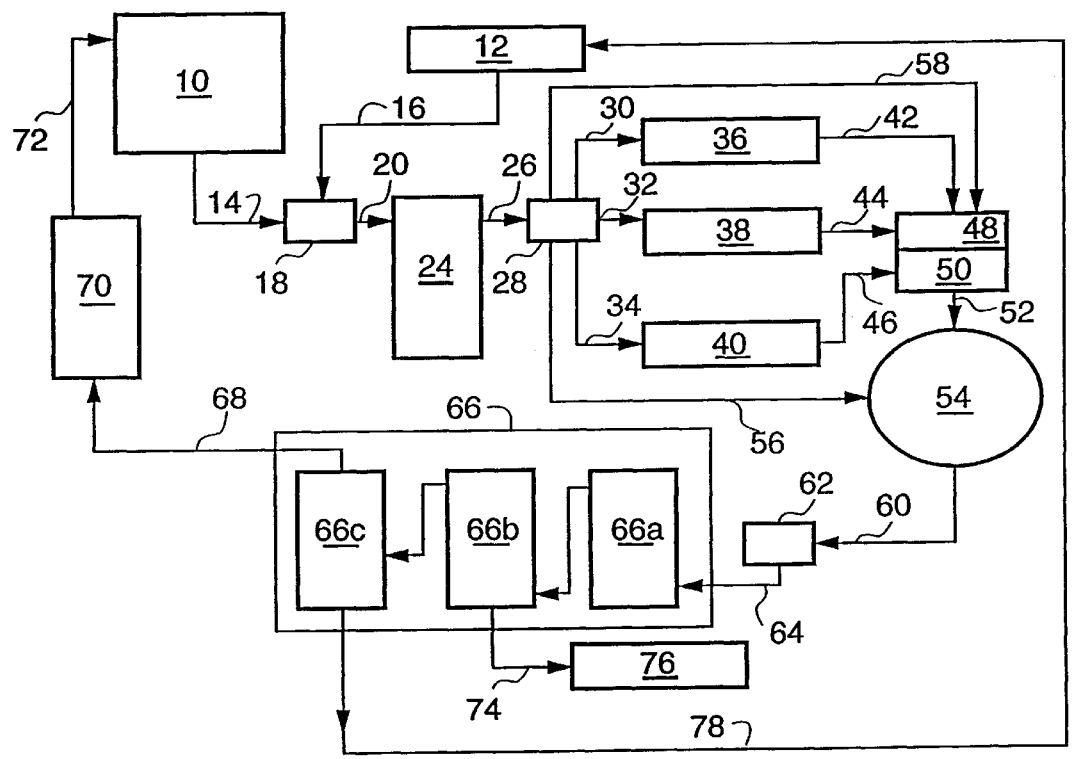
FIG. 1 is a schematic diagram of an invention apparatus employed for contacting photoresist material on a substrate with a mixture of dense phase fluid and dense phase fluid modifier.

There has been invented an apparatus for providing a pulsed fluid to a reaciton site or to the surface of a material to be treated with the pulsed fluid.

The present invention comprises: at least one reservoir for the fluid; valved conduits connecting each of the reservoirs to a pumping means; a conduit with control valves from the pumping means to one or more ballast tanks with the control valves able to sequentially or intermittently direct a flow of fluid into each of the ballast tanks; conduits from each of the ballast tanks to a control and injection valve which injects fluid from the conduits from each of the ballast tanks into a processing vessel where the reaction sites or material to be treated is contacted with the fluid. Additionally, there may be direct conduits from the control valves which are connected to the one or more ballast tanks to the processing vessel to provide a means for conducting a flow of only one of several feedstock fluids or a direct unpulsed flow of the fluid or fluid mixture directly into the processing vessel, bypassing the ballast tanks.

If treatment with a pulsed supercritical fluid is needed, as, for example, when a pulsed supercritical fluid mixture is used for removing photoresist materials from the surface of a substrate, then a high pressure processing vessel and pumps capable of producing and maintaining high pressures would be used.

If desired, the feedstock fluid, or fluid mixture, as well as any contaminants picked up from the reaction or material being treated can simply be conducted away from the process and treated, stored or transported as needed.

For recycling the processing fluid, a conduit from the processing vessel can be connected to a separator vessel, a multi-unit separator vessel, or more than one separator vessel connected in series. In the separator vessel or vessels, the processing fluid or fluid mixture with any contaminant materials in it can be processed in any of several ways, depending upon the products desired, economic factors, and equipment, space and engineering capabilities.

For example, when the invention apparatus is being used to pulse a supercritical mixture of dense phase fluid and dense phase fluid modifier against a substrate coated with photoresist material, at least three different separator vessel arrangements can be used for different choices of processing methods.

In a first scenario, a single separator vessel could be used to contain the mixture while adjusting the temperature and pressure to values at which the photoresist material is no longer soluble and precipitates out. The remaining dense phase fluid and dense phase fluid modifier would then be recycled together.

In a second scenario, a separator vessel or compartment of a separator vessel can be used to contain the mixture while reducing the pressure and increasing the temperature to values at which the supercritical dense phase fluid would boil off leaving a mixture of the dense phase fluid modifier and photoresist material. The dense phase fluid (then in a gas phase) is recondensed to liquid and reused in the process. The dense phase fluid modifier and photoresist material would then be separated in another vessel or compartment of a single separator vessel.

In a third, presently preferred scenario, a multi-unit separator vessel is used to first adjust the temperature and pressure of the mixture so that the photoresist material is no longer soluble and precipitates out, then in a second unit the dense phase fluid is boiled off the dense phase fluid modifier by reduction of pressure and increasing of temperature.

As needed in this example of use of the invention apparatus for removal of photoresist material, conduits are provided whereby the dense phase fluid modifier can be directed to a means for separating the dissolved photoresist material, then returning the cleaned dense phase fluid modifier to the dense phase fluid modifier reservoir for reuse in the invention process or conducting the dense phase fluid modifier elsewhere for other purposes.

Also in this example, conduits are also provided as needed as means for the vaporized supercritical fluid to be conducted to a condenser where it is condensed, then returned to the dense phase fluid reservoir for reuse in the invention process or conducted elsewhere for other purposes.

Generally, the number of ballast tanks needed is that number sufficient to render the process as continually efficient as possible by providing a reliable, ready source of pressurized fluid at any time needed by simply alternating choice of tank.

Although one or more embodiments of the invention apparatus can be used for almost any application which requires use of pulsed fluids to contact reaction sites or surfaces, the invention apparatus is particularly useful for removing hard baked photoresist materials from substrates which have been coated with electricaly conductive barrier layers and photoresist materials, preheated, selectively photoexposed and developed, etched and hard baked during the manufacture of electronic components including integrated circuits and circuit boards.

At the beginning of the final step of the photolithographic process commonly used for manufacturing integrated circuits and circuit boards, a pattern of layers of electrically conductive barrier material and hard baked photoresist material which has protected the conductive barrier material during the etching step of the photolithographic process remain on the substrate. In accordance with this invention, the hard baked photoresist material is removed by contacting it with pulses of a mixture of at least one dense phase fluid and at least one dense phase fluid modifier by use of the invention apparatus and method.

Dense phase fluid in a liquid state is most conveniently used as a starting component, but for purposes of the present example it is subjected to pressures and temperatures sufficiently high to maintain the fluid in a supercritical state, behaving simultaneously like a liquid (in density) and a gas (in diffusivity) and able to dissolve the dense phase fluid modifier. The necessary pressure and temperature will depend upon which dense phase fluid is used.

Dense phase fluids which are useful for this purpose are generally those in which the selected modifiers will dissolve in sufficient quantities to effectively remove photoresist materials. These include, but are not limited to, carbon dioxide, argon, helium, nitrogen, ethane, methane, propane and butane. Presently most preferred is carbon dioxide because it is non-flammable, non-toxic, has easily achievable critical phase, and is an excellent solvent for ethers.

An amount of dense phase fluid sufficient to dissolve the selected amount of modifier and adequate to contact the area of photoresist material to be removed is needed.

Generally presently preferred as dense phase fluid modifiers because of their relatively high boiling points, high polarity, low toxicity, and biodegradability are cyclic compounds having the functional group:

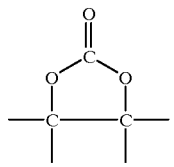

and ethers having the functional group:

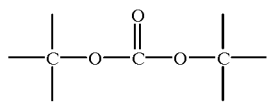

Generally, dense phase fluid modifiers presently preferred include, but are not limited to, ethers within the formula:

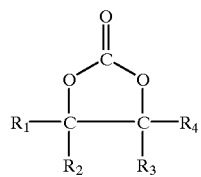

wherein $R_1$, $R_2$, $R_3$, and $R_4$ are substituents selected from the group of hydrogen, hydrocarbon groups having from 1 to 10 carbon atoms, halogens, and halogenated hydrocarbon groups having from 1 to 10 carbon atoms; and wherein each of $R_1$, $R_2$, $R_3$, and $R_4$ can be the same or different substituents; and ethers within the formula:

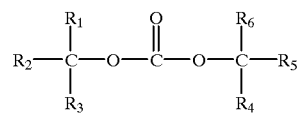

wherein $R_1$, $R_2$, $R_3$, and $R_4$ are substituents selected from the group of hydrogen, hydrocarbon groups having from 1 to 10 carbon atoms, halogens, and halogenated hydrocarbon groups having from 1 to 10 carbon atoms; and wherein each of $R_1$, $R_2$, $R_3$, and $R_4$ can be the same or different substituents.

The cyclic ethers are generally considered more useful because there is less likelihood of steric hinderance than would be present with open chain ethers.

Presently preferred dense phase fluid modifiers include, but are not limited to, propylene carbonate (1,3-dioxalane-2-one,4-methyl), ethylene carbonate, butyl carbonate, dimethyl sulfoxide, and gamma-butyrolacetone (2,4-dioxalane-3-one).

Dense phase fluid modifiers which are completely soluble in the selected dense phase fluid are particularly useful because complete solubility in the dense phase fluid facilitates removal of all of the modifier from the surface being treated along with the dense phase fluid in a single step.

An amount of dense phase fluid modifier sufficient to break the chemical bonds in the photoresist polymer to the extent necessary for removal of the photoresist material is needed.

When a dense phase fluid modifier is virtually completely soluble in the supercritical fluid, a solvent solution which stays in a single supercritical phase is formed.

The mixture of dense phase fluid and dense phase fluid modifier which forms the single supercritical phase of solvent is prepared by combining selected amounts of each of the components while maintaining sufficient pressure and temperature to keep the supercritical single phase fluid in a supercritical state. A wide range of pressures and temperatures can be used to maintain the components in a single supercritical phase, depending upon the selection of components. For example, when carbon dioxide is selected as the dense phase fluid and propylene carbonate is selected as the dense phase fluid modifier, a pressure of at least 1080 psi and a temperature of at least 31° C. are needed on both the dense phase fluid and the dense fluid modifier.

The substrates having patterned coatings of electrically conductive barrier material and hard baked photoresist material can be first contacted with the selected invention composition components in the selected proportionate amounts in a soaking period. During the soaking period the coated substrates are immersed in the static supercritical fluid mixture at a temperature and pressure sufficient to keep the fluid mixture in the supercritical phase.

The coated substrates are then contacted by sequenced pressure driven pulses of the supercritical fluid mixture at temperatures which maintain the fluid in a supercritical state. The pressure sequences are generally pulses of fluid at high pressures followed intersticially by periods of time in which the pressure of the fluid in contact with the coated substrate being treated is allowed to drop to a lower, but still elevated pressure. The high pressure pulses of fluid presently preferred are generally in the range from about 550 to about 10,500 psi in order to contact the coated substrate with sufficient force to remove the solubilized or softened photoresist materials. Presently more preferred are high pressure pulses of fluid in the range from about 1,500 to about 5,000 psi, depending upon which solvent solution components are used and upon temperatures employed. Presently most preferred when using carbon dioxide as the dense phase fluid and propylene carbonate as the dense phase fluid modifier are high pressure pulses of fluid in the range from about 2,000 to about 4,000 psi.

During the soaking period, if a soaking period is employed, when the high pressure vessel is simply filled with the photoresist removal fluid, the pressure is held in the range from about 500 psi to about 10,000 psi.

During the lower pressure periods of contact, the photoresist removal fluid is generally at a pressure in the range from about 500 to about 10,000 psi. Presently more preferred are low pressure periods of fluid at a pressure in the range from about 1,100 psi to about 2,000 psi.

During both the soaking period and the lower pressure periods of contact, the modified supercritical fluid causes the hard baked photoresist material to soften and debond from the electrically conductive barrier layer on the substrate.

During the high pressure pulsed times when the pressure of the supercritical processing fluid contacting the coated substrate is significantly increased, the softened and debonded photoresist materials are dissolved and washed away from the coated substrate by the supercritical processing fluid.

Using the invention apparatus, after the photoresist is removed to a level consistent with or better than existing wafer industry standards, a final rinse of the substrate can be made with unmodified supercritical fluid to remove any residual modifier.

An example of an embodiment of the invention in which such an apparatus with three ballast tanks is employed to remove photoresist material from coated substrates is shown schematically in FIG. 1.

With reference to FIG. 1, separate reservoirs 10 and 12 are provided for the dense phase fluid and the dense phase fluid modifier, respectively. These reservoirs can also function as long term storage facilities for these components. Alternatively, a single reservoir can be used to contain a mixture of dense phase fluid and dense phase fluid modifier.

A conduit 14 connects the dense phase fluid reservoir 10 with a control valve 18 which admits selected proportionate amounts of the dense phase fluid with amounts of dense phase fluid modifier dispensed from the dense phase fluid modifier reservoir 12 through a conduit 16 to the control valve 18. The control valve 18 is connected by a conduit 20 to a high pressure pump 24. The control valve 18 also can be used for purposes of dispensing unmodified dense phase fluid into the conduit 20 for use when it is desired to flush the system or do a final rinse step with unmodified dense phase fluid.

The high pressure pump 24 has the capability of producing the desired fluid pressure and creating high volume flow.

The wafers to be treated are positioned and held in a high pressure process vessel 54 by any suitable means. For example, the wafers can be attached to a shelf which is suspended in the high pressure process vessel 54 by brackets. The wafers are placed so that the pulses of fluid impact directly onto the photoresist material to be removed.

The high pressure process vessel 54 is isolated and depressurized for placing wafers into and removing wafers from the high pressure process vessel 54.

A first soaking step may be employed to soften and begin dissolution of the photoresist material. If it is desired to employ a soaking step, the high pressure pump 24 is used to pump an invention mixture of dense phase fluid and dense phase fluid modifier having the proportionate amounts dispensed by the control valve 18 through a conduit 56 directly into the high pressure processing vessel 54. The high pressure processing vessel 54 is maintained at sufficiently high temperature and pressure to keep the invention solvent mixture in supercritical phase.

In such a soaking step, the wafers are allowed to soak in the static supercritical mixture in the high pressure process vessel 54 for a period of time in the range from about 30 seconds to about 10 minutes to soften and/or generally degrade the photoresist material which is to be removed.

The high pressure pump 24 is then employed to pump the selected invention mixture of dense phase fluid and dense phase fluid modifier through a conduit 26 into a control valve 28 which is capable of sequentially or intermittently releasing pre-determined portions of the mixture of dense phase fluid and dense phase fluid modifier through each of three conduits 30, 32 and 34. Three different contacts in the control valve 28 can be electronically activated to control the pressure of the mixture released into each of the three conduits 30, 32 and 34.

Each of the three conduits 30, 32 and 34 are connected to one of three ballast tanks 36, 38 and 40. Generally it is preferred to have at least one of the ballast tanks being fully pressurized while pressure is being released from at least one other of the ballast tanks by having fluid from it going into a multiport control valve 48 which will inject the fluid through an injection valve 50 and conduit 52 into a high pressure process vessel 54.

For example, still with reference to FIG. 1, when pressurized fluid is coming from conduit 30 into ballast tank 36 pressurizing ballast tank 36, the valve 48 is closing off the conduit 42 from ballast tank 36; meanwhile, pressurized fluid from ballast tank 38 is simultaneously being released through conduit 44 into the multiport control valve 48 which is allowing the pressurized fluid from ballast tank 38 to pass into the injection valve 50 for injection into the high pressure process vessel 54. In this example, ballast tank 40 may be getting pressurized with fluid from conduit 34 with the associated conduit 46 to the multiport control valve 48 closed off during pressurization. Alternatively, depending upon need for pressure to produce the desired intervals and pressures for the pulses of fluid entering the high pressure process vessel 54, fluid may be getting released from ballast tank 40 through conduit 46 into the multiport control valve 48 for injection through the injection valve 50 into the high pressure process vessel 54.

The supercritical fluid mixture is pumped at high pressure pulses alternating with low pressure pulses across the surface of substrates with photoresist coating. When the apparatus described is used, the length of the pressure pulses is the time necessary to reduce the amount of pressure in whichever ballast tank is dispensing the pressure pulse to equilibrium with the pressure in the high pressure process vessel 54.

Fluid mixture which has been used to contact the photoresist on substrates in the high pressure process vessel 54 is then conducted away from the high pressure process vessel 54 after each pulse of invention fluid mixture against the wafers in the high pressure process vessel 54. This is accomplished by opening control valve 62 on conduit 60, releasing built up pressure in the high pressure process vessel 54 until the pressure in the high pressure process vessel 54 is back down to the soaking period pressure level.

The substrates with photoresist coating are treated with pulses of invention single phase supercritical solvent mixture in the high pressure process vessel for a period of time sufficient to allow complete removal of the photoresist material. Depending upon the pressure, temperature, speed and volume of the pulses and the proportionate amounts of dense phase fluid and dense phase fluid modifier, a period of at least about a minute generally is needed. A period of time longer than about 30 minutes is not generally necessary if the other factors are optimized.

With this release of pressure from the high pressure process vessel 54, the fluid mixture conducted away from the high pressure process vessel 54 through conduit 60 having thereon a valve 62 is transported by conduit 64 into a separator vessel 66.

The separator vessel 66 can be in any suitable configuration needed to separate the dense phase fluid from the dense phase fluid modifier which has the photoresist material dissolved therein, and also, if desired, to separate the dissolved photoresist material from the dense phase fluid modifier. One example of a useful separator vessel 66 is a three-stage multistage separation unit with means for separately controlling the heat for each of three sections 66a, 66b, and 66c, of the separator vessel 66.

In this example of a separator vessel, first section 66a of the multistage separation unit 66 is used for preheating the invention supercritical fluid mixture containing the dissolved photoresist material. After the temperature is increased to a temperature high enough to allow the single phase miscible mixture of the dense phase fluid and the dense phase fluid modifier to "boil off" of the photoresist material, the mixture passes into a second section 66b of the separation unit.

In the second section 66b of the separation unit 66 of this example, the pressure is sufficiently controlled to allow the photoresist material to precipitate out of the single phase miscible mixture of the dense phase fluid and the dense phase fluid modifier. The photoresist material precipitates out of the miscible mixture of the dense phase fluid and the dense phase fluid modifier because of the inability of the single phase miscible mixture to hold the photoresist material in solution at the reduced pressure.

Then a third section 66c of the multistage separation unit 66 of this example is used for separation of the dense phase fluid from the dense phase fluid modifier. In the third section 66c the temperature and/or pressure are still further controlled in order for the differential in vapor pressures of the two fluids to cause separation of the two fluids into two phases.

Depending upon which dense phase fluid is selected, the separator vessel 66 is maintained at a temperature in the range from about 0° C. to about 100° C. For example, when using carbon dioxide as the dense phase fluid and propylene carbonate as the dense phase fluid modifier, the separator vessel 66 is maintained at a temperature in the range from about 0° C. to about 25° C. When a multistage separator vessel is used, this step is accomplished in the first 66a stage of the separator vessel 66.

The decrease in pressure causes the supercritical or subcritical component of the dense phase fluid mixture to separate and leave the separator vessel 66 as a gas through a conduit 68. The conduit 68 empties the gas phase fluid into a condenser 70 where the gas phase fluid is liquefied. The liquefied dense phase fluid can then be returned through conduit 72 to the dense phase fluid reservoir 10 for reuse in the invention process if desired. Alternatively, the dense phase fluid can be removed from the reactor loop.

A means 66b for separating dissolved or mechanically carried photoresist material from the dense phase fluid modifier can be incorporated in the separator vessel 66. In this example, the dense phase fluid modifier from which the photoresist material has been removed is then returned through conduit 78 to the dense phase fluid modifier reservoir 12 if desired. Any separated photoresist material is conducted to a means 76 for collecting the separated photoresist material by conduit 74. Alternatively, the dense phase fluid modifier with dissolved photoresist material can be pumped from the separator unit 66 and removed from the reactor loop for separation at a remote unit.

After treatment of the coated substrates with a sufficient number of pulses of invention fluid mixture to remove the photoresist, a final unmodified fluid rinse of the substrate wafers is made by pumping unmodified dense phase fluid from the dense phase fluid reservoir 10 through the "three-way" valve 28, thence through a separate conduit 58, bypassing the ballast tanks, directly into the multiport control valve 48 for injection into the high pressure process vessel 54.

Use of the invention apparatuses and processes makes unnecessary the final step in which the substrate with the electrically conductive pattern on it is washed with deionized water to ensure that all traces of organic solvents and sulfates are removed from the wafer surface. The supercritical processing fluid solution does not leave behind any of the dense phase fluid modifier since the dense phase fluid modifier is completely soluble in the supercritical fluid.

The invention apparatus and method are suitable for or easily modified for a large number of applications because the apparatus and method are useful for applying a large range of pressures, volumes, temperatures, times and sequences of pulses of any fluids which can be pumped through the apparatus.

EXAMPLE I

Figure 2:
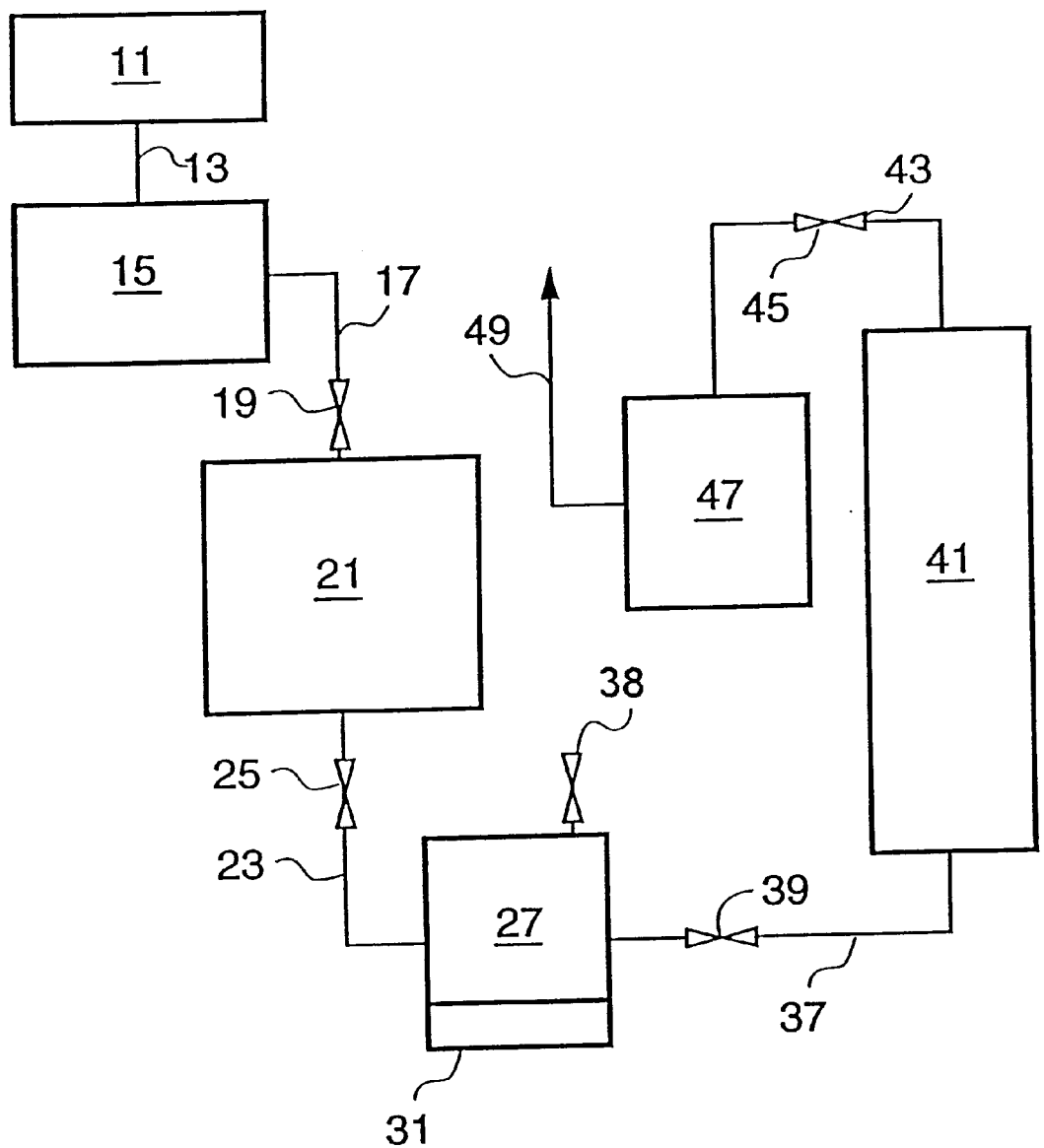
FIG. 2 is a schematic of an invention apparatus for providing pulsed fluid to a pressure vessel.

An invention run was made using a single-ballast fluid pulse providing apparatus to demonstrate operability of the invention. For making the invention run described in this example, equipment was set up in the manner shown in the schematic of FIG. 2.

Carbon dioxide was used as the dense phase fluid and propylene carbonate was used as the dense phase fluid modifier for removing photoresist material from the silicon substrate of a semiconductor chip wafer.

A mixture of 5% propylene carbonate and 95% carbon dioxide supplied by H. P. Gas Products, Inc., in a standard size A syphon cylinder was used as feed material from the propylene carbonate and carbon dioxide reservoir 11. The pressure in the syphon cylinder was approximately 900 psi at room temperature, which was enough to maintain the contents in liquid form.

The propylene carbonate and carbon dioxide reservoir 11 was connected by a conduit 13 to an ISCO™ 260D syringe pump 15 which was in turn connected by conduit 17 to a Whitey™ 304L-HDF4 1000 cc high pressure sample cylinder which served as a ballast tank 21. The conduit 17 between the syringe pump 15 and the ballast tank 21 had a pressure relief valve 19.

On the downstream side of the ballast tank 21 a ¼" outside diameter stainless tubing conduit 23 connected the ballast tank 21 to a DUR-O-LOK™ quick opening high pressure filter housing which was modified to serve as a cleaning vessel 27. The DUR-O-LOK™ filter housing, manufactured by C. F. Technologies, was modified by addition of a pressure relief port and machining of the inside of the vessel to allow for tie-down points for the special wafer holding arrangement. The modified vessel was recertified to meet A.S.M.E. Code, Sec. VIII, Div. 1 standards.

A positioning fixture was designed for holding the silicon wafers in the cleaning vessel 27. The wafer positioning fixture was a stainless steel disc of approximately 2 inches in diameter that was counterbored to accept a second disc which had the wafer mounted in it.

The active volume of the cleaning vessel 27 was approximately 320 cc.

The high pressure input through conduit 23 to the cleaning vessel 27 was positioned to allow for the injection of the dense phase fluid mixture directly onto the surface of the silicon wafers.

A high wattage heater 29, thermocouple 31, pressure vent valve 33 and pressure relief valve 35 were installed on the quick opening high pressure filter housing being modified to serve as the cleaning vessel 27.

High pressure tubing (304 stainless steel rigid tubing and Swagelok™ flexible teflon bore stainless overbraided tubing) was used as a conduit 37 for connecting the cleaning vessel 27 with a high pressure filter housing manufactured by Autoclave Engineers which was modified to serve as a surge tank 41. A precision micrometer bellows needle valve 39 was installed in the conduit 37 to allow for the controlled release of excess pressure from the cleaning vessel 27 while maintaining the cleaning vessel 27 pressure above the critical point.

The high pressure filter housing which was modified to serve as the surge tank 41 had a 2-liter volume and allowed for ample expansion of pressure from the cleaning vessel 27.

A conduit 43 with a valve thereon connected the surge tank 41 with a 5-liter tank which was adapted to serve as a water bubbler 47 to trap the propylene carbonate from the gaseous mixture being released from the surge tank 41. A conduit 49 from the water bubbler 47 conducted cleaned carbon dioxide away from the water bubbler 47 where it could be released into the atmosphere. Water with propylene carbonate in solution was removed from the water bubbler 47 as needed.

Before pressurization was started for this demonstration run, the ballast tank 21 and the cleaning vessel 27 were preheated to 50° C. Two variable voltage transformers were used to control separately the temperatures of the ballast tank 21 and the cleaning vessel 27.

The carbon dioxide and propylene carbonate mixture was flowed into the system and allowed to fill the high pressure syringe pump 15, the ballast tank 21 and the cleaning vessel 27. The resulting pressure was approximately 900 psi and the fill took about two full minutes.

Once the fill was complete, the high pressure syringe pump 15 was used to bring the cleaning vessel 27 and the ballast tank 21 up to approximately 1100 psi, which was critical pressure. Then the valve 25 between the ballast tank 21 and the cleaning vessel 27 was closed Patent and the pump 15 was operated for about 5 minutes to pressurize the ballast tank 21 to approximately 1600 psi. This five-minute period became the "wafer soak time" used in the cleaning vessel 27.

Once the ballast tank 21 was pressurized to 1600 psi, the valve 25 was opened to release the pressure into the cleaning vessel 27. The difference in pressures in the ballast tank 21 (1600 psi) and the cleaning vessel 27 (1100 psi) caused the dense phase fluid mixture of carbon dioxide and propylene carbonate to spray directly onto the wafers with high pressure and high velocity, thereby removing photoresist from the wafers. The photoresist was believed to be going into solution in the dense phase fluid mixture of carbon dioxide and propylene carbonate.

The pressure in the ballast tank 21 and the cleaning vessel 27 was allowed to equilibrate, equalizing at approximately 1400 psi. After equilibration of the ballast tank 21 and cleaning vessel 27 pressures, the downstream micrometer bellows valve 39 was opened for a time (about 1 minute) sufficient to allow the ballast tank 21 and cleaning vessel 27 pressures to drop to 1100 psi.

Then the micrometer bellows valve 39 and the valve 25 between the ballast tank 21 and the cleaning vessel 27 were closed. With the micrometer bellows valve 39 and the valve 25 between the ballast tank 21 and the cleaning vessel 27 closed, the high pressure syringe pump 15 was reactivated to repressurize the ballast tank 21 to repeat the above described procedure with another pressure pulse across the silicon wafers in the cleaning vessel 27. The procedure was repeated a total of three times.

After the three pressure pulses had been completed, the entire system was depressurized and the special fixture holding the silicon wafer was removed from the cleaning vessel 27 and rinsed with deionized and filtered water.

Analysis of the silicon wafer showed that substantially all photoresist material had been removed from the wafer by the pulses of fluid.

While the processes and articles of manufacture of this invention have been described in detail for the purpose of illustration, the inventive processes and articles are not to be construed as limited thereby. This patent is intended to cover all changes and modifications within the spirit and scope thereof.

INDUSTRIAL APPLICABILITY

The invention apparatuses and processes can be employed for any application in which it is desired to pulse a fluid against or across a surface, particularly for the purpose of pulsing a supercritical fluid against or across a surface to remove material soluble in that particular solvent.

The invention apparatuses and processes can be used for removing photoresist materials from both metallized and nonmetallized substrates during manufacture of electronic parts, particularly semiconductor chips and wafers. The invention apparatuses and processes can also be used for applications in other manufacturing processes requiring photoresist masking, such as the production of optical waveguides and flat-panel displays.

What is claimed is:

1. An apparatus for providing pulsed fluids to processing vessels comprising:
   (a) at least one reservoir for the fluid to be pulsed;
   (b) at least one valved conduit connecting the reservoir to a pumping means;
   (c) at least one conduit with control valves from said pumping means to one or more ballast tanks with the control valves able to sequentially or intermittantly direct a flow of fluid into each of said one or more ballast tanks;
   (d) conduits from each of the ballast tanks to a control and injection valve which injects fluid from the conduits from each of said one or more ballast tanks into a processing vessel.

2. An apparatus as recited in claim 1 wherein at least one conduit connects said at least one reservoir for fluid to be pulsed directly with said processing vessel, thereby providing a means for introducing fluid directly into said processing vessel, bypassing said one or more ballast tanks.

3. An apparatus as recited in claim 2 further having a preprogrammable control device on said means for introducing fluid directly into said processing vessel.

4. An apparatus as recited in claim 1 wherein said processing vessel is a high pressure processing vessel and wherein said pumping means is capable of producing and maintaining high pressures.

5. An apparatus as recited in claim 4 wherein said said high pressures are sufficiently high to maintain fluids in a supercritical state.

6. An apparatus as recited in claim 1 wherein said processing vessel is connected by a conduit to a storage vessel downstream from said processing vessel.

7. An apparatus as recited in claim 1 wherein said processing vessel is connected by a conduit to at least one additional processing vessel downstream from said processing vessel.

8. An apparatus as recited in claim 7 wherein said at least one additional processing vessel is a separator and has at least one conduit connecting said at least one additional processing vessel with said reservoir for fluid to be pulsed and at least one conduit for conducting substances other than fluid to be pulsed away from said at least one additional processing vessel.

9. An apparatus as recited in claim 8 wherein said separator has connected therewith a cooling device and valves which can be adjusted to allow reduction of pressure therein.

10. An apparatus as recited in claim 8 further having a valve and preprogrammable control device on said at least one conduit connecting said at least one additional processing vessel with said reservoir for fluid to be pulsed.

11. An apparatus as recited in claim 7 wherein said at least one additional processing vessel has two separate compartments, a first of which has connected therewith a cooling device and valves which can be adjusted to allow reduction of pressure therein and also connected therewith a conduit to a condensation vessel to receive gaseous discharge from said first separate compartment; and a second compartment of which can contain liquid and solid materials.

12. An apparatus as recited in claim 11 wherein said condenser is connected by conduit to said reservoir for fluids to be pulsed so as to enable recirculation of condensed fluid to said reservoir for fluids to be pulsed.

13. An apparatus as recited in claim 12 further having a valve and preprogrammable control device on said conduit to said reservoir for fluids to be pulsed.

14. An apparatus as recited in claim 11 further having a valve and preprogrammable control device on said conduit to said condensation vessel to receive gaseous discharge from said first separate compartment.

15. An apparatus as recited in claim 7 wherein said at least one additional processing vessel is a multi-unit separator vessel which has a first separate compartment which has connected therewith a cooling device and valves which can be adjusted to allow reduction of pressure therein and which is fluidly connected with a second separate compartment which has a heater connected therewith for boiling off fractions of fluid contained therein.

16. An apparatus as recited in claim 15 wherein said second separate compartment is connected by a conduit to said at least one reservoir for fluid to be pulsed and by another conduit to conduct fluids and solids not boiled off away from said second separate compartment.

17. An apparatus as recited in claim 16 further having a valve and preprogrammable control device on said conduit to said at least one reservoir for fluid to be pulsed.

18. An apparatus as recited in claim 8 further having a valve and preprogrammable control device on said conduit to said at least one additional processing vessel downstream from said processing vessel.

19. An apparatus as recited in claim 1 having two ballast tanks.

20. An apparatus as recited in claim 1 having three ballast tanks.

21. An apparatus as recited in claim 1 wherein said reservoir for fluids to be pulsed has connected therewith a temperature controller and a means for maintaining pressure in said reservoir for fluids to be pulsed.

22. An apparatus as recited in claim 21 wherein said temperature controller and means for maintaining pressure are sufficient to enable containment therein of fluids in a supercritical state.

23. An apparatus as recited in claim 1 having two separate reservoirs for fluids to be pulsed, each of which is connected by valved conduits to said pumping means.

24. An apparatus as recited in claim 23 further having a valve and preprogrammable control device on said conduit to said valved conduits to said pumping means.

25. An apparatus as recited in claim 1 further having a preprogrammable control device on said at least one valved conduit connecting the reservoir to a pumping means.

26. An apparatus as recited in claim 1 further having a preprogrammable control device on said at least one conduit with control valves from said pumping means to said one or more ballast tanks.

27. An apparatus as recited in claim 1 further having a preprogrammable control device on said conduits from each of the ballast tanks to said control and injection valve.

28. A method of pulsing fluids onto the surface of a material to be treated comprising:
   (a) containing a treating fluid under pressure in a reservoir connected to a pump;
   (b) pumping said treating fluid under pressure into one or more ballast tanks;
   (c) releasing said treating fluid from one of said one or more ballast tanks into a processing vessel wherein a material to be treated is positioned;
   (d) conducting treating fluid away from said processing vessel; thereafter,
   (e) another pulse of said treating fluid from one of said one or more ballast tanks is released into said processing vessel;
   (f) after pressure in said one of said one or more ballast tanks and in said processing vessel is equalized, treating fluid is conducted away from said processing vessel.

29. A method as recited in claim 28 wherein said one of said one or more ballast tanks in step (e) is being filled and pressurized with said treating fluid contemporaneously with release of said treating fluid from said one of said one or more ballast tanks in step (c).

30. A method as recited in claim 28 wherein said treating fluid which is conducted away from said processing vessel is conducted into a separator.

31. A method as recited in claim 30 wherein a gaseous portion of said treating fluid from said separator is recycled back into said reservoir.

32. A method as recited in claim 28 wherein said treating fluid is maintained in a supercritical state in said reservoir and in a dense phase state in said ballast tanks.

33. A method as recited in claim 28 wherein after said treating fluid is released from one of said one or more ballast tanks into said processing vessel, pressure in said one of said one or more ballast tanks and in said processing vessel is equalized.

34. A method of pulsing fluids onto the surface of a material to be treated comprising:
(a) containing two or more treating fluids under pressure in two or more reservoirs connected to a pump;
(b) combining said treating fluids to form a mixture and pumping said mixture under pressure into one or more ballast tanks;
(c) releasing said treating fluid mixture from one of said one or more ballast tanks into a processing vessel wherein the material to be treated is positioned;
(d) after pressure in said one of said one or more ballast tanks and in said processing vessel is equalized, treating fluid mixture is conducted away from said processing vessel; thereafter,
(e) another pulse of said treating fluid mixture from one of said one or more ballast tanks is released into said processing vessel;
(f) after pressure in said one of said one or more ballast tanks and in said processing vessel is equalized, treating fluid mixture is conducted away from said processing vessel.

35. A process as recited in claim 34 wherein said treating fluids are combined prior to pumping into said one of said one or more ballast tanks.

36. A process as recited in claim 34 wherein said treating fluids are pumped separately into said one of said one or more ballast tanks.

37. A process as recited in claim 34 wherein said treating fluids are pumped into a conduit simultaneously to form a mixture therein prior to entering said one of said one or more ballast tanks.

38. A method as recited in claim 34 wherein said one of said one or more ballast tanks in step (e) is being filled and pressurized with said treating fluid contemporaneously with release of said treating fluid from said one of said one or more ballast tanks in step (c).

39. A method as recited in claim 34 wherein said treating fluid which is conducted away from said processing vessel is conducted into a separator.

40. A method as recited in claim 39 wherein a gaseous portion of said treating fluid from said separator is recycled back into said reservoir.

41. A method as recited in claim 34 wherein said treating fluid is maintained in a supercritical state in said reservoir and in a dense phase state in said ballast tanks.

* * * * *